United States Patent [19]

Ohishi et al.

[11] Patent Number: 5,036,372
[45] Date of Patent: Jul. 30, 1991

[54] HETEROJUNCTION AVALANCHE TRANSISTOR

[75] Inventors: Toshiyuki Ohishi; Yuji Abe; Hiroshi Sugimoto; Ken-ichi Ohisuka; Teruhito Matsui, all of Amagasaki, Japan

[73] Assignee: Mitsubishi Denki Kabushiki Kaisha, Japan

[21] Appl. No.: 579,681

[22] Filed: Sep. 10, 1990

[30] Foreign Application Priority Data

Sep. 11, 1989 [JP] Japan .................... 1-232883

[51] Int. Cl.$^5$ ............................ H01L 29/161
[52] U.S. Cl. ............................ 357/16; 357/13; 357/34; 357/61
[58] Field of Search ............ 357/13, 16, 34, 61

[56] References Cited

U.S. PATENT DOCUMENTS 4,979,009 12/1990 Kusano et al. ............ 357/16

OTHER PUBLICATIONS

Shen et al., "Bidirectional Bistability in n-p-n Si/Si$_{1-x}$-Ge$_x$/Si Structures", IEEE Electron Device Letters, vol. 9, No. 9, Sep. 1988, pp. 453-456.

*Primary Examiner*—Edward J. Wojciechowicz
*Attorney, Agent, or Firm*—Leydig, Voit & Mayer

[57] ABSTRACT

An avalanche transistor has a heterojunction emitter-base junction. The avalanche transistor includes a spacer layer provided between an emitter layer and a base layer. The spacer layer has an energy band gap between that of the base layer and that of the emitter layer, a carrier concentration lower than that of the base layer, and a thickness so that the whole spacer layer becomes a depletion layer at thermal equillibrium so that a neutral region is produced in the spacer layer at a voltage lower than the threshold voltage of the emitter-base junction. Thus, the same element is both bistable with the base current as a parameter and has an S-shaped negative differential resistance with the base voltage as a parameter.

3 Claims, 2 Drawing Sheets

HETEROJUNCTION AVALANCHE TRANSISTOR

FIELD OF THE INVENTION

The present invention relates to a bistable heterojunction avalanche transistor having an S-shaped negative differential resistance characteris.

BACKGROUND OF THE INVENTION

FIG. 2(a) is a cross-sectional view showing a conventional heterojunction avalanche transistor. FIG. 2(b) shows collector current vs. collector voltage characteristics with a parameter of base current in a common-emitter configuration. FIG. 2(c) shows collector current vs. collector voltage characteristics with a parameter of base voltage in a common-emitter configuration. In FIG. 2, reference numeral 1 designates a semi-insulating InP substrate. An n+ type InGaAsP contact layer 2 is disposed on the entire surface of the substrate 1. An n type InP emitter layer 3 is disposed on the center portion of the contact layer 2. A p type InGaAsP base layer 4 is disposed on the entire surface of the emitter layer 3. An n type InP collector layer 5 is disposed on the center portion of the base layer 4. A collector electrode 6 is connected with the collector layer 5 via an n+ type InGaAsP contact layer 2A. A base electrode 7 is connected with the base layer 4 via a Zn diffusion region 9 produced on the periphery of the base layer 4. An emitter electrode 8 is connected with the emitter layer 3 via the contact layer 2.

Collector current vs. collector voltage characteristics as a parameter of base current in a common-emitter configuration will be described with reference to FIG. 2(b). In a bipolar transistor, collector current $I_C$ is represented as follows:

$$I_C = \left( \frac{1}{(M\alpha\gamma)^{-1} - 1} \right) I_B \quad (1)$$

where $I_B$ is base current, M is carrier multiplication factor in the base-collector junction, $\alpha$ is base transport factor, and $\gamma$ is emitter injection efficiency. In the conventional heterojunction avalanche transistor, since the energy band gap of the emitter layer is larger than that of the base layer, the emitter injection efficiency $\gamma$ can be regarded as 1. When the collector current $I_C$ is increased, the collector voltage is mainly applied to the emitter-base junction when the collector current $I_C$ is low. However, once the resistance of the emitter-base junction decreases, the emitter-base voltage scarcely increases further and the current at this junction becomes a constant voltage source. Therefore, when the collector current $I_C$ is further increased, the collector voltage is applied to the base-collector junction, which leads to the increase of the reverse bias at the base-collector junction. The base transport factor $\alpha$ approaches 1 as the collector current $I_C$ increases, and the carrier multiplication factor M increases as the base-collector reverse bias increases. Then, as the collector voltage increases, $M\alpha\gamma$ of the equation (1) approaches 1, whereby the collector current $I_C$ drastically increases. When the collector current is further increased, $M\alpha\gamma$ may exceed 1. However, $M\alpha\gamma$ cannot exceed 1 from the equation (1). Since the base transport factor $\alpha$ approaches to 1 in accordance with the increase in the collector current $I_C$, the carrier multiplication factor M decreases to keep $M\alpha\gamma$ below 1. The decrease in the carrier multiplication factor M means a decrease in the collector voltage. Then, S-shaped negative differential resistance, which means that the collector voltage decreases in accordance with an increase in the collector current $I_C$, is obtained (base currents represented by A in FIG. 2(b)).

At some value of base current, no S-shaped negative differential resistance is obtained, but the collector current drastically increases in accordance with the increase in the collector voltage when $M\alpha\gamma$ approaches 1 but does not exceed 1 (base currents represented by B in FIG. 2(b)).

Next, collector current vs. collector voltage characteristics with a parameter of base voltage in a common-emitter configuration will be described with reference to FIG. 2(c). When the collector voltage is lower than the base voltage, since both of the emitter-base junction and the base-collector junction are forward biased and the transistor is in a saturated region, the collector current increases in accordance with the increase in the collector voltage. When the collector voltage is further increased, the base-collector junction is reverse biased. Therefore, the collector current is approximately determined by the base voltage. When the collector voltage is further increased, the reverse bias of the base-collector junction increases, and as a result the carrier multiplication factor M increases and the term of $M\alpha\gamma$ in the equation (1) approaches 1. Then, similarly as the situation described with reference to FIG. 2(b), S-shaped negative differential resistance appears at the base voltage where $M\alpha\gamma$ is about to exceed 1, and the collector current drastically increases against the collector voltage at the base voltage where $M\alpha\gamma$ approaches 1 but does not exceed 1.

In such a conventional heterojunction avalanche transistor, since the base transport factor $\alpha$ approaches 1 in accordance with an increase in the collector current, B the S-shaped negative differential resistance characteristic is only obtained in both cases by taking the base current and taking the base voltage as a parameter, respectively, in the common-emitter configuration. Therefore, when a memory circuit is constituted using such a heterojunction avalanche transistor, a bistable memory element is required in addition to the heterojunction avalanche transistor as a trigger element.

SUMMARY OF THE INVENTION

The present invention is directed to solving the above-described problems and has for its object to provide a bistable heterojunction avalanche transistor having an S-shaped negative differential resistance.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In a heterojunction avalanche transistor in accordance with the present invention, a spacer layer, which has an energy band gap between that of the base layer and that of the emitter layer, a carrier concentration lower than that of the base layer, and a thickness producing a neutral region at a voltage lower than the threshold voltage of the emitter-base junction, is provided between the emitter layer and the base layer.

In accordance with the present invention, when a neutral region is produced in the spacer layer, a diffusion current of holes flows through in this neutral region to reduce the carrier injection efficiency. Therefore, bistability is obtained in the common-emitter configuration with a parameter of base current.

DETAILED DESCRIPTION OF THE PREFERRED EMBODIMENT

An embodiment of the present invention will be described in detail with reference to the drawings.

Figure 1A:
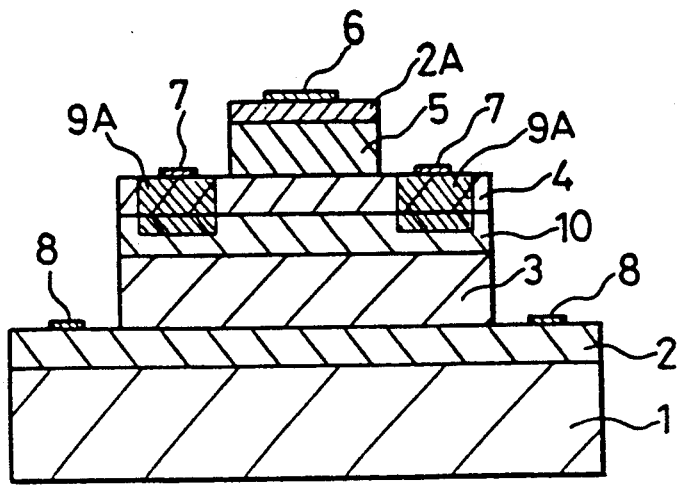
FIG. 1(a) is a cross-sectional view showing a heterojunction avalanche transistor in accordance with an embodiment of the present invention.
Figure 1B:
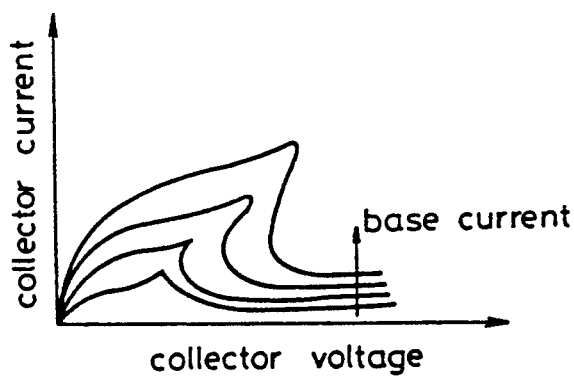
FIG. 1(b) is a diagram showing collector current vs. collector voltage characteristics with a parameter of base current in the common-emitter configuration.
Figure 1C:
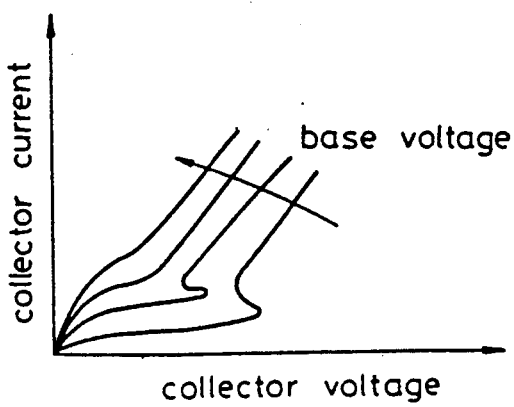
FIG. 1(c) is a diagram showing collector current vs. collector voltage characteristics with a parameter of base voltage in the common-emitter configuration.
Figure 2A:
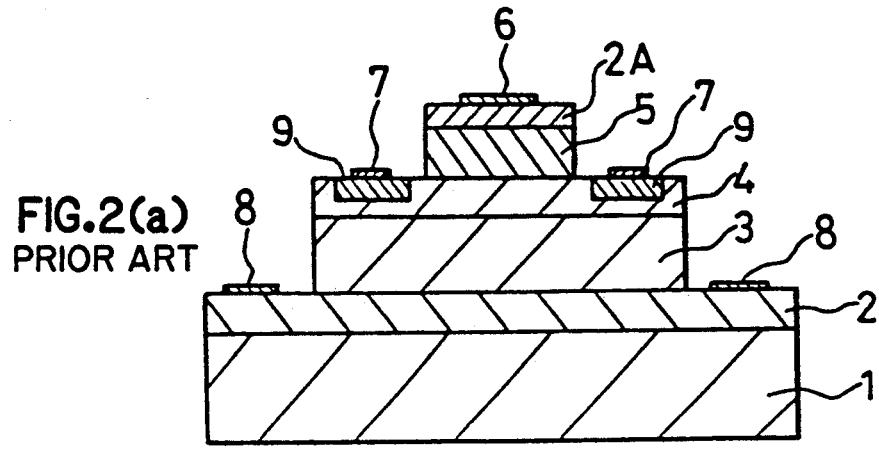
FIG. 2(a) is a cross-sectional view showing a conventional heterojunction avalanche transistor.
Figure 2B:
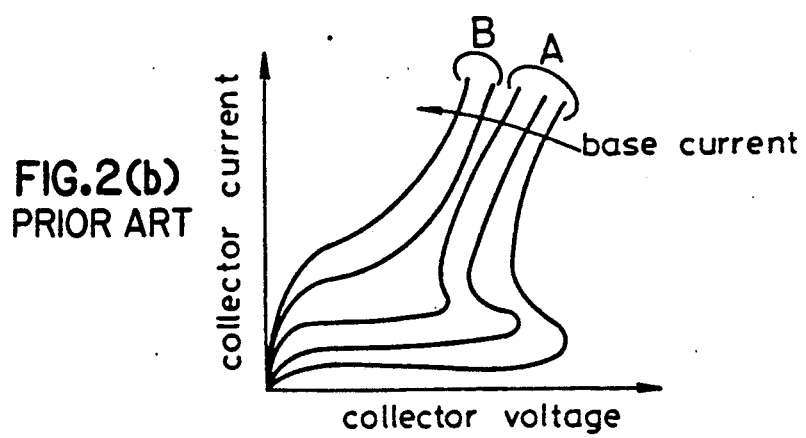
FIG. 2(b) is a diagram showing collector current vs. collector voltage characteristics with a parameter of base current in the common-emitter configuration for the heterojunction avalanche transistor of FIG. 2(a)
Figure 2C:
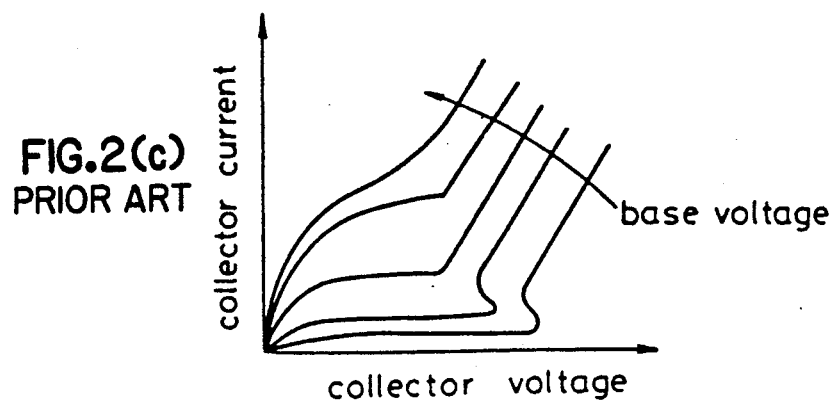
FIG. 2(c) is a diagram showing a collector current vs. collector voltage characteristics with a parameter of base voltage in the common-emitter configuration for the heterojunction avalanche transistor of FIG. 2(a).

FIG. 1(a) is a cross-sectional view showing a heterojunction avalanche transistor in accordance with an embodiment of the present invention. FIG. 1(b) shows collector current vs. collector voltage characteristics with a parameter of base current in a common-emitter configuration. FIG. 1(c) shows collector current vs. collector voltage characteristics with a parameter of base voltage in a common-emitter configuration. In these figures, the same reference numerals designate the same or corresponding portions as those shown in FIG. 2. An n type InGaAsP spacer layer 10 is inserted between an n type InP emitter layer 3 and a p type InGaAsP base layer 4. A Zn diffusion region 9A is provided penetrating through the base layer 4 and into the spacer layer 10. The n type InGaAsP spacer layer 10 has an energy band gap between that of the n type InP emitter layer 3 and that of the p type InGaAsP base layer 4 and a carrier concentration lower than that of the p type InGaAsP base layer 4, for example, $\sim 3 \times 10^{16}$ cm$^{-3}$. The spacer layer 10 is about 0.1 micron thick and this film thickness enables the whole spacer layer becomes a depletion layer at thermal equilibrium. When the whole spacer layer 10 is a depletion layer, there is no reverse injection of holes from the p type InGaAsP base layer 4 to the n type InP emitter layer 3 and the emitter injection efficiency $\gamma$ is considered as 1, similarly as in the conventional heterojunction avalanche transistor. However, when the emitter-base junction is forward biased, the depletion layer shrinks and a neutral region is produced in the n type InGaAsP spacer layer 10. In this state, a diffusion current of holes flows from the p type InGaAsP base layer 4 to the n type InP emitter layer 3, resulting in a reduction in the emitter injection efficiency $\gamma$. Thus, the n type InGaAsP spacer layer 10 reduces the emitter injection efficiency $\gamma$ thereby to reduce the current gain when the emitter current exceeds some value.

Next, collector current vs. collector voltage characteristics with a parameter of base current will be described with reference to FIG. 1(b). When the collector current is increased, the collector voltage is mainly applied to the emitter-base junction similarly as in the collector current vs. collector voltage characteristics shown in FIG. 2(b) when the collector current is low. When the collector current is further increased, the resistance of the emitter-base junction decreases and the base-collector junction is reversely biased to increase the base-collector voltage. The base transport factor $\alpha$ approaches 1 in accordance with increase in the collector current, and the carrier multiplication factor M increases in accordance with an increase in the base-collector voltage. When the whole n type InGaAsP spacer layer 10 is a depletion layer in this state, the emitter injection efficiency $\gamma$ is considered as 1 and M$\alpha\gamma$ approaches 1. Then, the collector current increases against the collector voltage as seen from the equation (1). When the collector current and the collector voltage further increase, M$\alpha\gamma$ may exceed 1. However, M$\alpha\gamma$ cannot exceed 1 physically from the equation (1) and it must be below 1. In the heterojunction avalanche transistor of FIG. 1(a), when the collector current increases and a neutral region is produced in the spacer layer 10, the base current increases. Here, since the base current is smaller than the emitter current and the collector current, the emitter current and the collector current are approximately equal to each other. Accordingly, when the collector current increases and M$\alpha\gamma$ is about to exceed 1, the carrier multiplication factor M and the emitter injection efficiency $\gamma$ decrease and M$\alpha\gamma$ becomes smaller than 1. Then, because the carrier multiplication factor M decreases, the collector voltage decreases. Furthermore, because the emitter injection efficiency decreases, the current gain decreases. Since the base current is constant, the collector current decreases when the current gain decreases. As described above, the collector current vs. collector voltage characteristics are bistable when base current is the parameter.

Next, collector current vs. collector voltage characteristics of FIG. 1(c) will be described. In FIG. 1(c), since the base voltage is made constant, the voltage applied to the emitter-base junction is constant and the state of the neutral region in the spacer layer 10 does not change so much. Therefore, when the collector current is increased, if M$\alpha\gamma$ is about to exceed 1, the carrier amplification factor M and only the collector voltage decreases, resulting in an S-shaped negative differential resistance similarly as in FIG. 2(c).

In the above-described embodiment a spacer layer having the same energy band gap as the base layer, carrier concentration of $3 \times 10^{16}$ cm$^{-3}$ and a thickness of 0.1 micron is used, but the spacer layer is not restricted thereto. Any spacer layer that shows a tendency for emitter injection efficiency $\gamma$ decreases when M$\alpha\gamma$ in the equation (1) is about to exceed 1 can be used. Preferably, the spacer layer can have an energy band gap between that of the emitter layer and that of the base layer and it is more effective if it is closer to that of the base layer. Furthermore, a carrier concentration of the spacer layer, one order of magnitude lower than that of the base layer is more effective and, a thickness of the spacer layer, of about 0.1 to 0.2 micron is more effective.

As is evident from the foregoing description, according to the present invention, a spacer layer, which has an energy band gap between that of the base layer and that of the emitter layer, a carrier concentration lower than that of the base layer, and a thickness producing a neutral region at a voltage lower than the threshold voltage of the emitter-base junction, is provided between the emitter layer and the base layer. Therefore, an element of the same structure can provide both a bistable characteristic with base current taken as a parameter and S-shaped negative differential resistance with the base voltage taken as a parameter.

What is claimed is:

1. An avalanche transistor having a heterojunction emitter-base junction comprising:

an emitter layer having an energy band gap;

a base layer having an energy band gap and a charge carrier concentration; and a spacer layer disposed between said emitter layer and said base layer having an energy band gap between that of said base layer and that of said emitter layer, a carrier concentration lower than that of said base layer, and a thickness for complete depletion at thermal equilibrium and for producing a neutral region in said spacer layer at a voltage lower than a threshold voltage of said emitter-base junction.

2. A heterojunction avalanche transistor as defined in claim 1 wherein said spacer layer has a carrier concentration one order of magnitude lower than that of said base layer.

3. A heterojunction avalanche transistor as defined in claim 1 wherein said spacer layer is 0.1 to 0.2 micron thick.

* * * * *

UNITED STATES PATENT AND TRADEMARK OFFICE
CERTIFICATE OF CORRECTION

PATENT NO. : 5,036,372

DATED : July 30, 1991

INVENTOR(S) : Ohishi et al

It is certified that error appears in the above-identified patent and that said Letters Patent is hereby corrected as shown below:

ON THE TITLE PAGE:

Item No. [75], Inventors, change "Ohisuka" to --Ohtsuka--.

Item No. [57], Abstract, line 8, change "equillibrium" to --equilibrium--.

Signed and Sealed this

Second Day of March, 1993

*Attest:*

STEPHEN G. KUNIN

*Attesting Officer*     Acting Commissioner of Patents and Trademarks